US012131931B2

(12) United States Patent
Yoon et al.

(10) Patent No.: US 12,131,931 B2
(45) Date of Patent: Oct. 29, 2024

(54) APPARATUS AND METHOD FOR MANAGING POWER OF ARTICLE TRANSPORT VEHICLE IN ARTICLE TRANSPORT SYSTEM

(71) Applicant: SEMES CO., LTD., Cheonan-si (KR)

(72) Inventors: Ki Sub Yoon, Suwon-si (KR); Dong Pil Kang, Daegu (KR)

(73) Assignee: SEMES CO., LTD., Cheonan-si (KR)

( * ) Notice: Subject to any disclaimer, the term of this patent is extended or adjusted under 35 U.S.C. 154(b) by 596 days.

(21) Appl. No.: 17/385,040

(22) Filed: Jul. 26, 2021

(65) Prior Publication Data
US 2022/0037182 A1      Feb. 3, 2022

(30) Foreign Application Priority Data

Jul. 28, 2020  (KR) .......................... 10-2020-0093682

(51) Int. Cl.
*H02J 50/00* (2016.01)
*H01L 21/677* (2006.01)
*H02J 50/80* (2016.01)

(52) U.S. Cl.
CPC ...... *H01L 21/67724* (2013.01); *H02J 50/005* (2020.01); *H02J 50/80* (2016.02)

(58) Field of Classification Search
CPC ... H01L 21/67724; H02J 50/80; H02J 50/005; H02J 50/00
USPC ...................................................... 180/65.31
See application file for complete search history.

(56) References Cited

U.S. PATENT DOCUMENTS

| | | | | |
|---|---|---|---|---|
| 7,137,344 | B2 * | 11/2006 | Kumar | ...................... B60L 9/02 180/65.265 |
| 8,567,207 | B2 * | 10/2013 | Sommer | ................. F04D 17/12 415/150 |
| 8,880,251 | B2 * | 11/2014 | Matsumoto | ....... H02J 7/007194 903/903 |
| 10,632,852 | B2 * | 4/2020 | Ricci | ..................... B60L 3/0092 |

(Continued)

FOREIGN PATENT DOCUMENTS

| | | |
|---|---|---|
| CN | 103782246 | 5/2014 |
| JP | 2002-320343 | 10/2002 |
| JP | 2018-107907 | 7/2018 |

OTHER PUBLICATIONS

Office Action from the China National Intellectual Property Administration dated Oct. 28, 2023.
(Continued)

*Primary Examiner* — Hau V Phan

(57) ABSTRACT

An apparatus for managing power of an article transport vehicle in an article transport system according to an embodiment of the present disclosure includes: a power receiving unit configured to receive a power in a contactless manner from a power supply unit installed at a driving route of the article transport vehicle and to control the power; a power storage unit configured to store a portion of the power supplied from the power receiving unit and to supply the stored power; a power generating unit configured to generate a driving power for driving the article transport vehicle and to generate a power by using the power supplied from the power receiving unit or the power storage unit; and a power control unit configured to control power paths between the power storage unit, the power receiving unit, and the power generating unit.

20 Claims, 9 Drawing Sheets

(56) References Cited

U.S. PATENT DOCUMENTS

2011/0041723 A1* 2/2011 Kumar .............. B60L 15/2045
105/35
2014/0217975 A1 8/2014 Hayashi

OTHER PUBLICATIONS

Office Action from the Korean Intellectual Property Office dated Jul. 10, 2023.

* cited by examiner

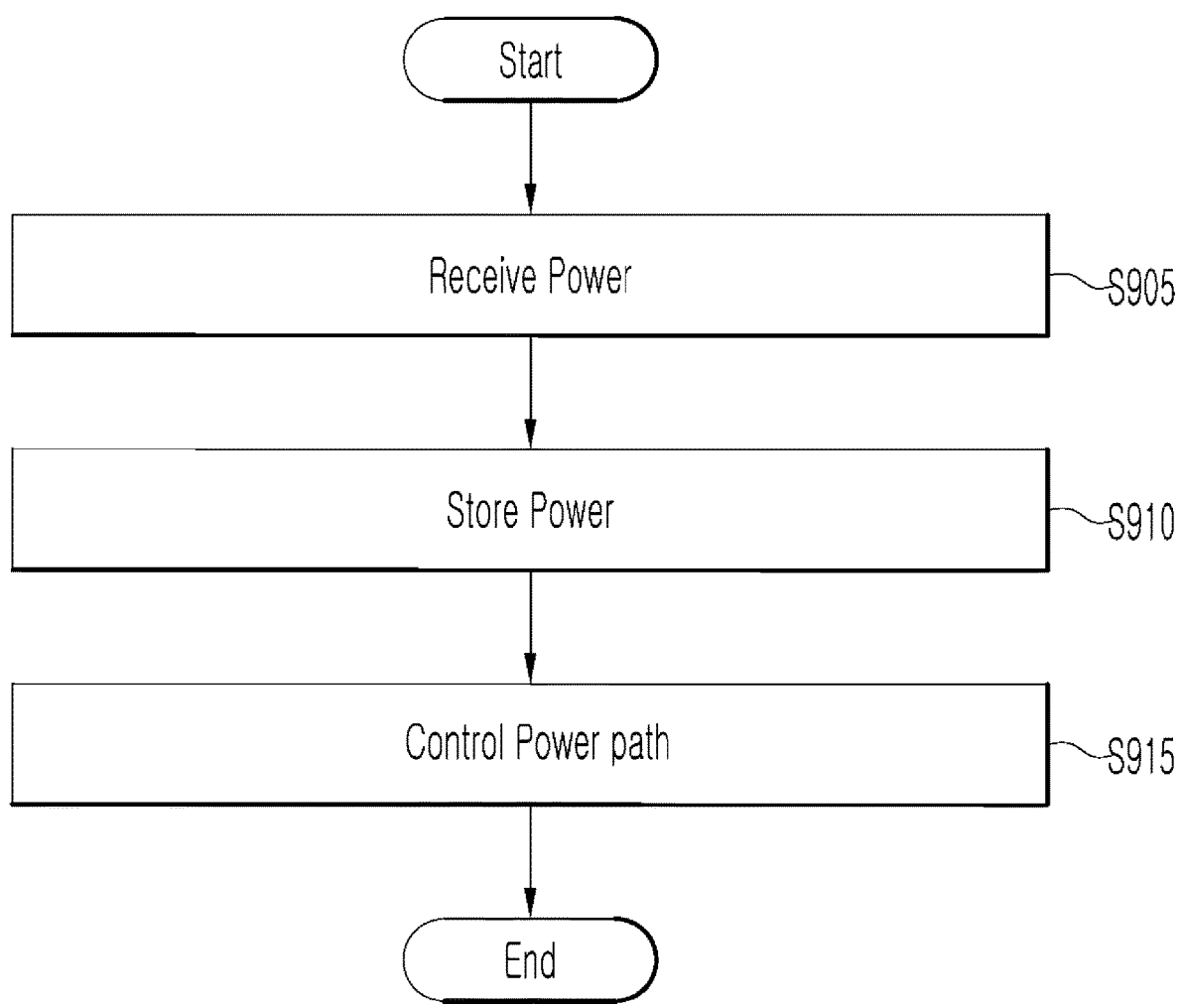

APPARATUS AND METHOD FOR MANAGING POWER OF ARTICLE TRANSPORT VEHICLE IN ARTICLE TRANSPORT SYSTEM

CROSS REFERENCE TO RELATED APPLICATION

The present application claims priority to Korean Patent Application No. 10-2020-0093682, filed on Jul. 28, 2020, the entire contents of which is incorporated herein for all purposes by this reference.

BACKGROUND OF THE INVENTION

Field of the Invention

The present disclosure relates generally to an apparatus and a method for managing power of an article transport vehicle in an article transport system. More particularly, the present disclosure relates to an apparatus and a method for managing power of an article transport vehicle which uses power by contactless power supply and charged power.

Description of the Related Art

A semiconductor (or display) manufacturing process is a process for manufacturing a semiconductor device on a substrate (e.g., a wafer), and for example, includes exposure, deposition, etching, ion implantation, cleaning, and packaging, and the like. A manufacturing plant for manufacturing semiconductor devices is composed of clean rooms on one or more floors, and manufacturing facilities for performing the semiconductor manufacturing process are disposed on each floor.

In order to maximize the efficiency of the semiconductor manufacturing process, not only a method of improving each semiconductor manufacturing process, but also a technique for rapidly and efficiently transporting article (e.g., substrates) between manufacturing facilities have been introduced. Typically, an overhead hoist transport (OHT) system that transports article along a path installed at the ceiling of a semiconductor manufacturing plant is being applied. Generally, the OHT system includes a rail constituting a driving route, and an article transport vehicle that drives along the rail and transports article. In addition, the OHT system may be provided with a storage system for storing article when it is necessary to store the article while the articles are transported between semiconductor manufacturing facilities.

Meanwhile, the article transport vehicle may use electric energy as a power source, and a power supply unit for supplying the electric energy to the article transport vehicle may be arranged along the rail. The power supply unit installed on the rail can transmit the electrical energy to the article transport vehicle by a contactless power transmission method, and such a contactless power supply system may be referred to as high-efficiency inductive power distribution (HID) or contactless power supply (CPS).

SUMMARY OF THE INVENTION

In an embodiment of the present disclosure, an apparatus and a method for managing power of an article transport vehicle are proposed in which the article transport vehicle can be efficiently driven in various situations.

Problems to be solved by the apparatus and method for managing power of an article transport vehicle of the present disclosure are not limited to those mentioned above, and other problems not mentioned will be clearly understood by those skilled in the art from the following description.

In order to achieve the above objective, according to one aspect of the present disclosure, there is provided an apparatus for managing power of an article transport vehicle in an article transport system, the apparatus including: a power receiving unit configured to receive a power in a contactless manner from a power supply unit installed at a driving route of the article transport vehicle and to control the power; a power storage unit configured to store a portion of the power supplied from the power receiving unit and to supply the stored power; a power generating unit configured to generate a driving power for driving the article transport vehicle and to generate a power by using the power supplied from the power receiving unit or the power storage unit; and a power control unit configured to control power paths between the power storage unit, the power receiving unit, and the power generating unit, wherein the power control unit allows the power to be supplied from the power receiving unit to the power generating unit or allows the power to be supplied from the power storage unit to the power generating unit on a basis of an operation state of the article transport vehicle such that the power control unit controls the power paths.

In the embodiment, when the power supply performed by the power supply unit stops, the power control unit may allow the power of the power storage unit to be supplied to the power generating unit.

In the embodiment, while the article transport vehicle accelerates, the power control unit may allow the power supplied from the power receiving unit and the power stored in the power storage unit to be supplied to the power generating unit.

In the embodiment, the power control unit may first allow power stored in a power storage part of the power storage unit to be supplied to the power generating unit, and may secondly allow power stored in an energy storage device of the power storage unit to be supplied to the power generating unit.

In the embodiment, while the article transport vehicle decelerates, the power control unit may allow regenerative energy generated by the power generating unit to be stored in the power storage unit.

In the embodiment, when the article transport vehicle initially enters the driving route, the power control unit may allow a power storage part to be charged by using power stored in an energy storage device of the power storage unit in a state in which the power supplied from the power supply unit is limited to a predetermined level or less.

In the embodiment, when an abnormality occurs in the article transport vehicle, the power control unit may allow a rated voltage output part of the power receiving unit to stop the power supplied from the power supply unit and monitor whether the abnormality of the article transport vehicle stops by using the power stored in the power storage unit, and when the abnormality of the article transport vehicle stops, the rated voltage output part of the power receiving unit may supply the power supplied by the power supply unit to the power generating unit.

A method for managing power of an article transport vehicle in the article transport system according to another aspect of the present disclosure includes: receiving power in a contactless manner from a power supply unit installed at a driving route of the article transport vehicle into a power receiving unit; storing a portion of the received power in a power storage unit; and controlling power paths by supplying the power from the power receiving unit to a power generating unit or by supplying the power from the power storage unit to the power generating unit on a basis of an operation state of the article transport vehicle.

In the embodiment, the controlling of the power paths may include supplying the power of the power storage unit to the power generating unit when the power supply performed by the power supply unit stops.

In the embodiment, the controlling of the power paths may include supplying the power supplied from the power receiving unit and the power stored in the power storage unit to the power generating unit while the article transport vehicle accelerates.

In the embodiment, the controlling of the power paths may include: first supplying power stored in a power storage part of the power storage unit to the power generating unit, and secondly supplying power stored in an energy storage device of the power storage unit to the power generating unit.

In the embodiment, the controlling of the power paths may include storing regenerative energy generated by the power generating unit in the power storage unit while the article transport vehicle decelerates.

In the embodiment, the controlling of the power paths may include: stopping the power supplied from the power supply unit by a rated voltage output part of the power receiving unit when an abnormality occurs in the article transport vehicle; monitoring whether the abnormality of the article transport vehicle stops by using the power stored in the power storage unit; and supplying the power supplied by the power supply unit to the power generating unit when the abnormality of the article transport vehicle stops.

The apparatus for managing power of an article transport vehicle in an article transport system according to still another aspect of the present disclosure includes: a power receiving unit comprising a power receiving end configured to receive power in a contactless manner from a power supply unit installed at a driving route of the article transport vehicle, and a rated voltage output part configured to output a rated voltage by using the power received by the power receiving end; a power generating unit comprising a driving control part electrically connected to the rated voltage output part and configured to control a driving power for driving the article transport vehicle, and a driving part configured to generate the power for driving the article transport vehicle; a power storage unit comprising an energy storage device configured to store a portion of the power supplied by the rated voltage output part and to supply the stored power to the rated voltage output part, and a power storage part connected to an output end of the rated voltage output part and configured to store power generated by the power generating unit and to supply the stored power to the power generating unit; and a power control unit configured to control power paths between the power storage unit, the power receiving unit, and the power generating unit, wherein the power control unit comprises: a switch configured to control electrical connection between the power receiving unit and the power generating unit; a control circuit configured to control the operation of the switch and electrical connection between the power receiving unit and the power storage unit; and a sensor configured to supply information on the output voltage of the rated voltage output part to the control circuit, wherein the control circuit controls the power paths on a basis of an operation state of the article transport vehicle.

In the embodiment, when the power supply performed by the power supply unit stops, the control circuit may allow the power stored in the energy storage device to be supplied to the driving control part.

In the embodiment, while the article transport vehicle accelerates, the control circuit may allow the power supplied by the rated voltage output part and the power stored in the power storage unit to be supplied to the driving control part.

In the embodiment, the control circuit may first allow the power stored in the power storage part to be supplied to the driving control part, and may secondly allow the power stored in the energy storage device to be supplied to the driving control part.

In the embodiment, while the article transport vehicle decelerates, the control circuit may allow regenerative energy generated by the power generating unit to be stored in the power storage unit.

In the embodiment, when the article transport vehicle initially enters the driving route, the control circuit may allow the power storage part to be charged by using the power stored in the energy storage device in a state in which the power supplied by the power supply unit is limited to a predetermined level or less.

In the embodiment, when abnormality occurs in the article transport vehicle, the control circuit may allow the rated voltage output part to stop the power supplied from the power supply unit and may monitor whether the abnormality of the article transport vehicle stops by using the power stored in the energy storage device, and when the abnormality of the article transport vehicle stops, the rated voltage output part may supply the power supplied by the power supply unit to the power generating unit.

According to the embodiment of the present disclosure, the power paths of power received from the power supply unit in a contactless manner and of power stored in the power storage unit are controlled, thereby realizing the efficient driving of the article transport vehicle in various situations.

Effect of the present disclosure is not limited to the effect mentioned above, and other effects not mentioned will be clearly understood by those skilled in the art from the following description.

BRIEF DESCRIPTION OF THE DRAWINGS

The above and other objectives, features, and other advantages of the present disclosure will be more clearly understood from the following detailed description when taken in conjunction with the accompanying drawings, in which:

FIG. 9 illustrates a flow chart of a method for managing the power of the article transport vehicle in the article transport system according to the embodiment of the present disclosure.

DETAILED DESCRIPTION OF THE INVENTION

Figure 1:
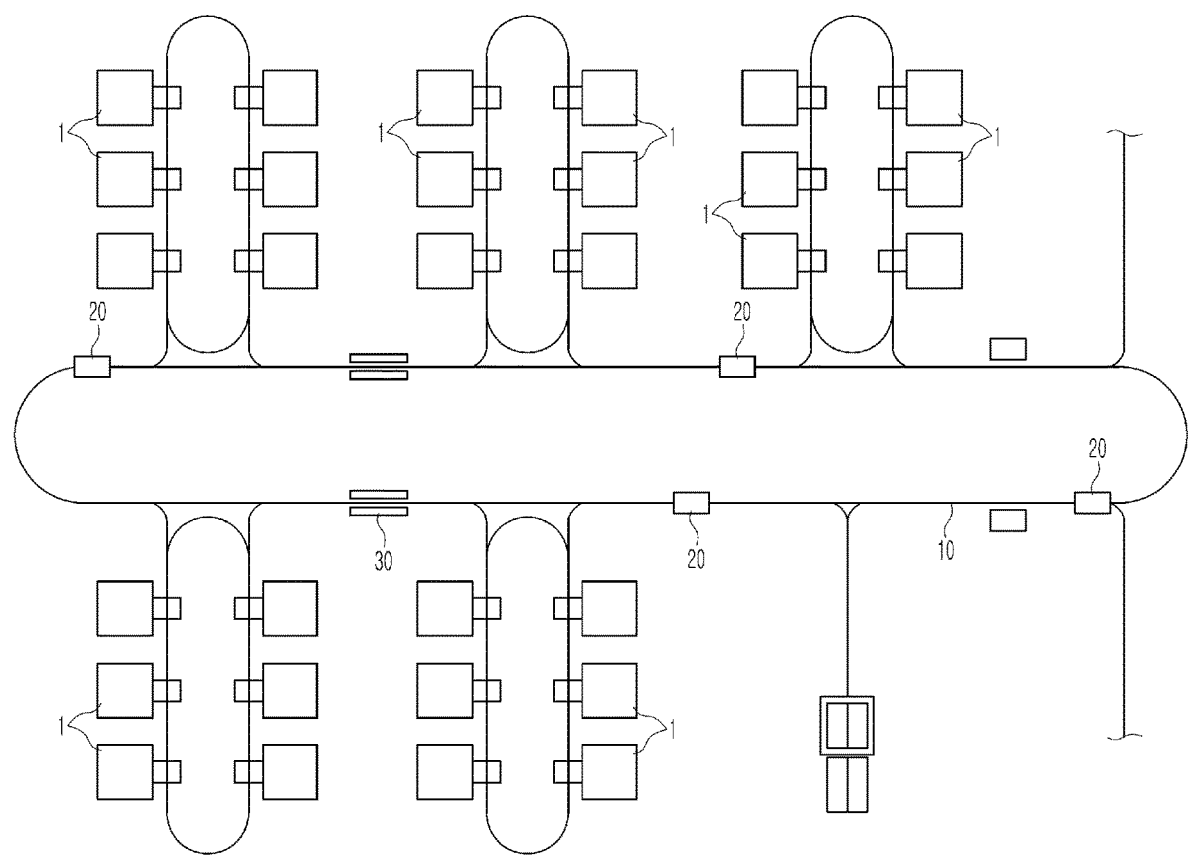
FIG. 1 illustrates an approximate example of a system for contactless power supply to an article transport vehicle in the article transport system.

Hereinafter, an exemplary embodiment of the present disclosure will be described in detail with reference to the accompanying drawings so that those skilled in the art to which the present disclosure pertains can easily practice the embodiment. The present disclosure can be implemented in many different forms and is not limited to the embodiment described herein.

In order to clearly describe the present disclosure, parts irrelevant to the description are omitted, and the same reference numerals are assigned to the same or similar elements throughout the specification.

In addition, in the embodiment, components having the same configuration will be described with the same reference numerals.

Throughout the specification, when a part is said to be "connected" to another part, this includes not only the case of being "directly connected", but also "indirectly connected" with other members interposed therebetween. Furthermore, when a part is said to "include" a certain component, this means that other components may be further included rather than excluding other components, unless otherwise stated.

Unless defined otherwise, all terms used herein, including technical or scientific terms, have the same meaning as commonly understood by a person skilled in the art to which the present disclosure pertains. Terms such as those defined in a commonly used dictionary should be interpreted as having meanings consistent with meanings in the context of related technologies, and should not be interpreted as ideal or excessively formal meanings unless explicitly defined in the present application.

FIG. 1 shows an example of a route for transporting article in a semiconductor or display manufacturing line. The semiconductor or display manufacturing line consists of one or more clean rooms, and manufacturing facilities for performing a manufacturing process may be installed in each clean room. Generally, a finally processed substrate may be completed by repeatedly performing a plurality of manufacturing processes of a substrate (e.g., a wafer). When a manufacturing process of a substrate in a specific semiconductor manufacturing facility is completed, the substrate is transported to a facility for a next manufacturing process. Here, the substrate may be transported with the substrate stored in a container (e.g., FOUP, a front opening unified pod) that can receive a plurality of substrates. The container receiving the substrates may be transported by a transport vehicle (e.g., an overhead hoist transport, OHT).

The OHT interfaces with a higher-level server commanding a transport work to the OHT through wireless communication while the OHT drives on a rail installed on a ceiling. The higher-level server receives a command on transport according to a work process from an integrated control system; searches for the shortest route from a place of origin to a destination such that an OHT completes a transport operation in the shortest time according to the command of the integrated control system; selects an OHT in an optimal position to perform the transport operation; and commands the transport to the OHT. According to the transport command of the higher-level server, the OHT transports article from a port commanded by the higher-level server to a destination port.

Referring to FIG. 1, a semiconductor or display manufacturing line may have the manufacturing facilities 1 for performing a manufacturing process installed therein, and may be provided with the rail 10 constituting a driving route (e.g., a ceiling rail) for transporting article between the manufacturing facilities 1 and a plurality of article transport vehicles 20 driving on the rail 10 and transporting the article to the manufacturing facilities 1. In this case, the article transport vehicle 20 may receive driving power through a power supply unit (e.g., a power supply cable) formed along the rail 10.

When the article transport vehicle 20 transports article between the manufacturing facilities 1, the article may be transferred directly from a specific manufacturing facility to another manufacturing facility, or may be transferred to another manufacturing facility after the articles are stored in a storage device. The storage device (e.g., an article storage part 30) may be installed at a side of the rail 10. The storage device may include a rack-type warehouse (a stocker) in which an inert gas can be injected to maintain a clean environment in the container; a rail side buffer installed to be adjacent to a side of the rail 10 so as to store article; a rail lower buffer installed at a lower area of the rail 10 so as to store article; and a maintenance lifter for maintaining and repairing the article transport vehicle.

Generally, the article transport vehicle receives power from the power supply unit in a contactless manner and may drive by using the received power. The article transport vehicle includes: a power receiving end 212 (or a pickup unit) configured to receive power from the power supply unit; a rated voltage output part (a regulator or a rated voltage output circuit) configured to output a rated voltage by using the power received from the power receiving end; and a driving control part (or a servo pack) for driving the article transport vehicle. Furthermore, when the article transport vehicle accelerates, only the rated voltage output by the rated voltage output part may be insufficient for the power of the article transport vehicle, so a power storage part (a capacitor array) supplying additional power may be included in the article transport vehicle. Additionally, when the article transport vehicle decelerates, the power storage part can store regenerative energy generated by a power generating unit, and when the article transport vehicle accelerates, the stored power may be used as the additional power to be supplied to the driving control part.

However, power that the power storage part may provide is limited. When power supply performed in a contactless manner by the power supply unit stops, the power storage part may supply power only for 1 to 2 seconds and then cannot supply power any longer. Accordingly, when a contactless power supply line is not installed on the rail or an abnormality occurs in the power supply line, the article transport vehicle cannot operate. In order to solve this problem, an article transport vehicle provided with an energy storage device (e.g., a secondary battery) composed of one or more electrochemical cells capable of charging and discharging electrical energy is applied, and a method of using the energy storage device after charging the energy storage device with power is being discussed. However, even in this case, the lifespan of the energy storage device is relatively short, so the energy storage device is required to be frequently replaced, which may increase costs.

Accordingly, in the embodiment of the present disclosure to be described below, there are proposed the apparatus and method for effectively managing power in which the power storage part according to a contactless power supply system and the energy storage device are used together and a control circuit properly controlling power paths according to the operation state of the article transport vehicle is applied.

Figure 2:
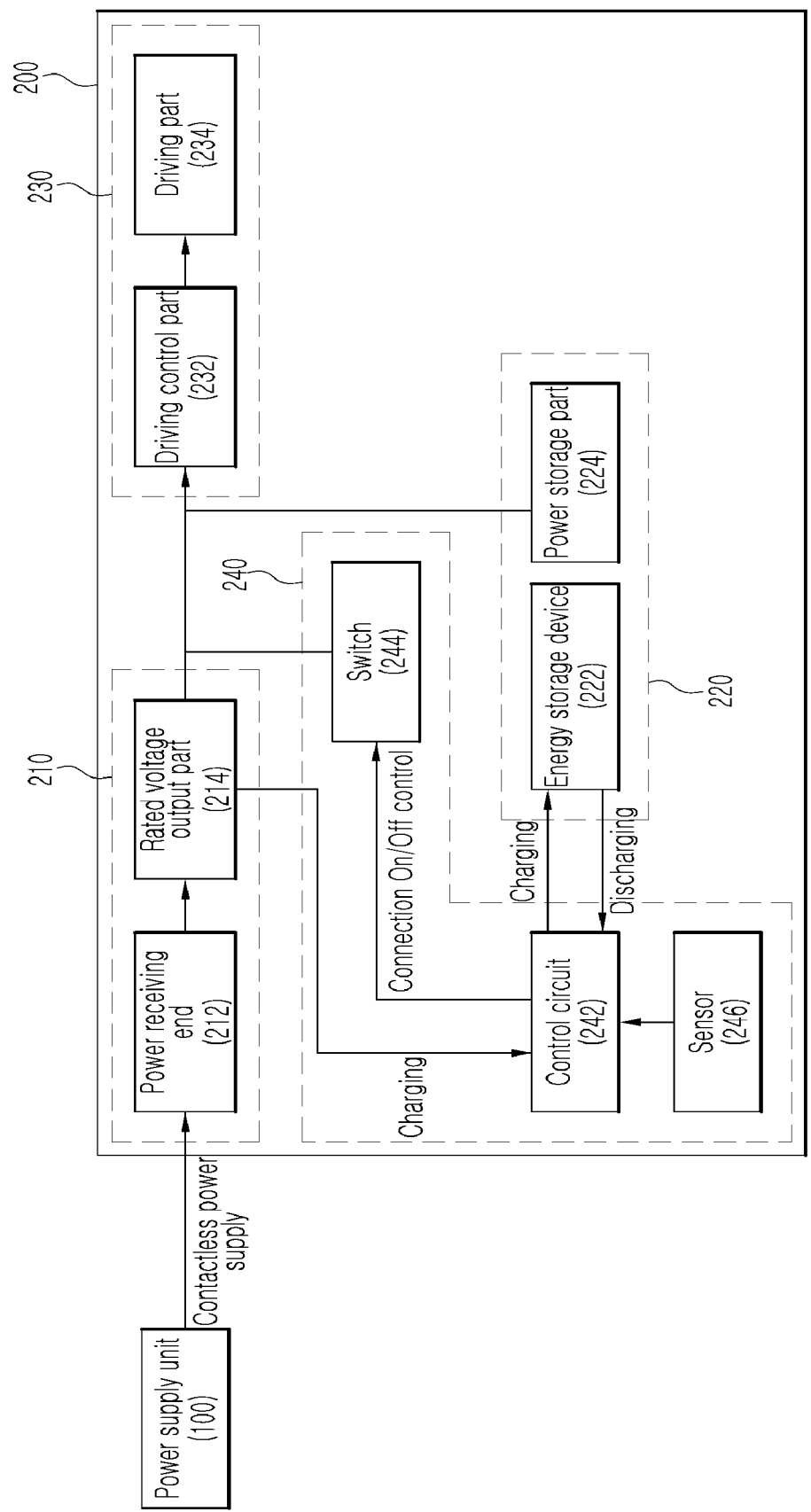
FIG. 2 is a view approximately illustrating an apparatus for managing power of an article transport vehicle in an article transport system according to an embodiment of the present disclosure.

FIG. 2 is an approximate view of an apparatus for managing power of an article transport vehicle in an article transport system according to an embodiment of the present disclosure. Referring to FIG. 2, the apparatus for managing power of an article transport vehicle includes: a power receiving unit 210 including the power receiving end 212 configured to receive power in a contactless manner from the power supply unit 100 installed at the driving route of the article transport vehicle and the rated voltage output part 214 configured to output the rated voltage by using the power received by the power receiving end 212; the power generating unit 230 including the driving control part 232 electrically connected to the rated voltage output part 214 and configured to control driving power for driving the article transport vehicle and a driving part 234 (e.g., a motor) configured to generate the power for driving the article transport vehicle; a power storage unit 220 including the energy storage device 222 configured to store a portion of the power supplied by the rated voltage output part 214 and to supply the stored power to the rated voltage output part 214, and the power storage part 224 connected to an output end of the rated voltage output part 214 and configured to store power generated by the power generating unit 230 and to supply the stored power to the power generating unit 230; and a power control unit 240 configured to control power paths between the power storage unit 220, the power receiving unit 210, and the power generating unit 230. The power control unit 240 includes: a switch 244 configured to control electrical connection between the power receiving unit 210 and the power generating unit 230; the control circuit 242 configured to control the operation of the switch 244 and electrical connection between the power receiving unit 210 and the power storage unit 220; and a sensor configured to supply information on the output voltage of the rated voltage output part 214 to the control circuit 242. Here, the control circuit 242 may control the power paths on the basis of the operation state of the article transport vehicle.

Figure 3:
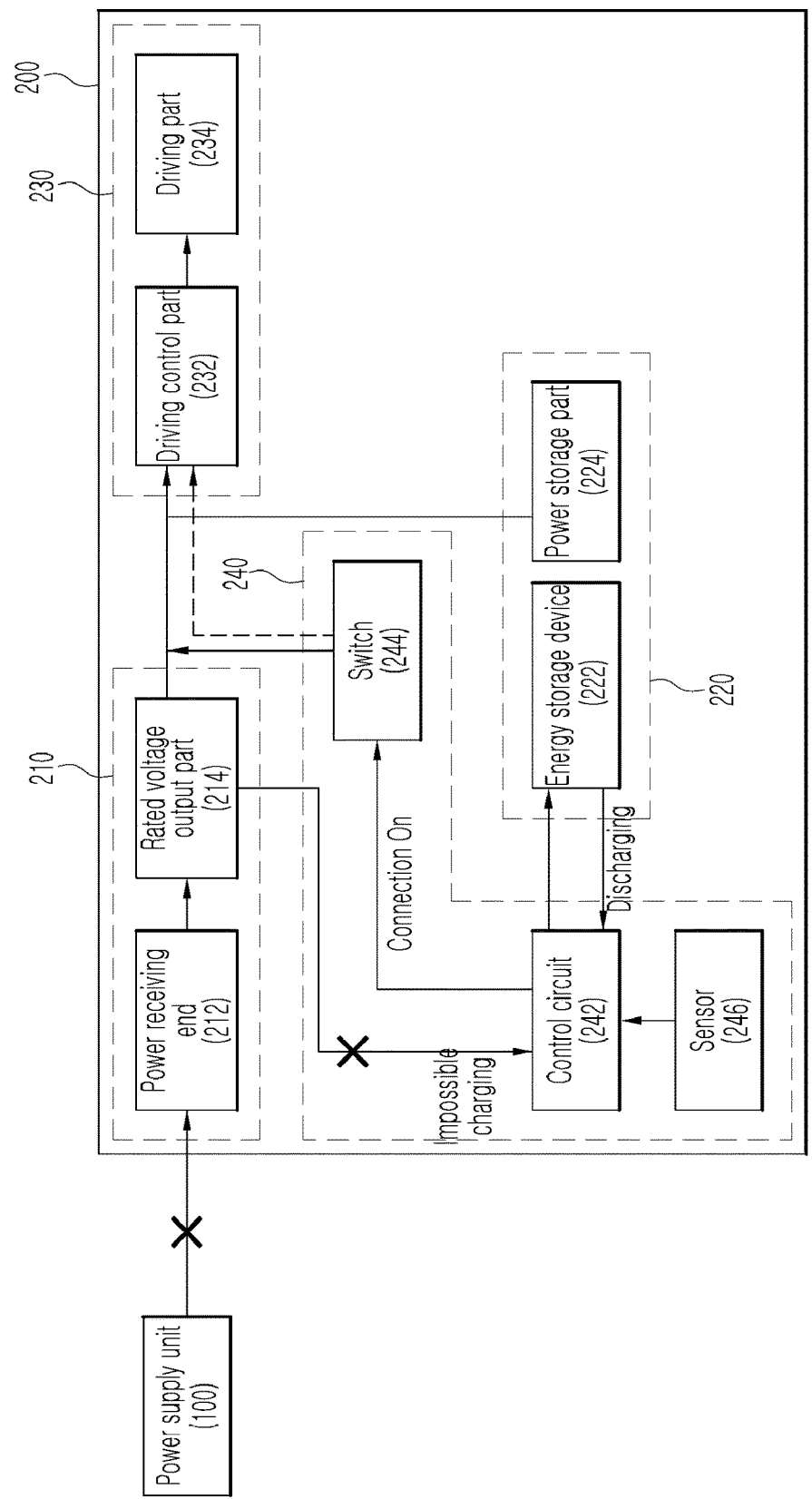
FIG. 3 illustrates an example of a process for managing the power in a case in which it is impossible to perform the contactless power supply in the article transport system according to the embodiment of the present disclosure.

FIG. 3 illustrates an example of a process for managing the power in a case in which it is impossible to perform the contactless power supply in the article transport system according to the embodiment of the present disclosure. Referring to FIG. 3, when power supply by the power supply unit 100 cannot be performed, power stored in the energy storage device 222 is supplied to the rated voltage output part 214, and the voltage output by the rated voltage output part 214 is supplied to the driving control part 232. That is, when the power supply by the power supply unit 100 stops, the control circuit 242 may supply power stored in the energy storage device 222 to the driving control part 232.

Figure 4:
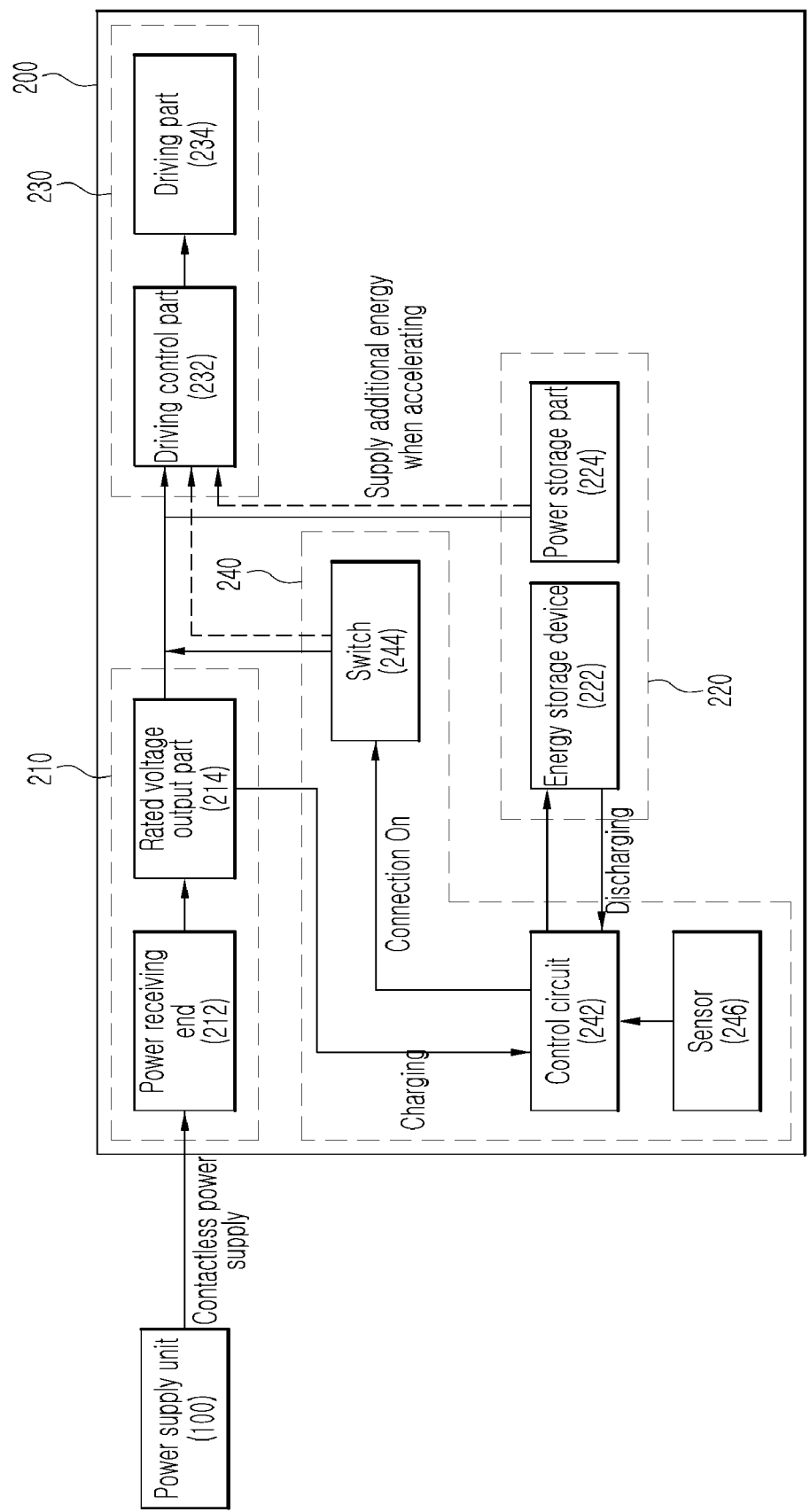
FIG. 4 illustrates an example of a process for managing the power when the article transport vehicle accelerates in the article transport system according to the embodiment of the present disclosure.

FIG. 4 illustrates an example of a process for managing the power when the article transport vehicle 200 accelerates in the article transport system according to the embodiment of the present disclosure. Referring to FIG. 4, when the article transport vehicle 200 enters an acceleration section and accelerates, the article transport vehicle 200 requires a voltage higher than the rated voltage output by the rated voltage output part 214 such that the article transport vehicle 200 accelerates. Accordingly, the voltage output by the rated voltage output part 214 and a voltage stored in the power storage unit 220 may be supplied to the driving control part 232. That is, while the article transport vehicle 200 accelerates, the control circuit 242 allows the power supplied from the rated voltage output part 214 and the power stored in the power storage unit 220 to be supplied to the driving control part 232.

In the embodiment, during the initial acceleration of the article transport vehicle, the power of the power storage part 224 is first supplied to the driving control part 232, and when the article transport vehicle continuously accelerates (when a predetermined time has elapsed), the power of the energy storage device 222 may be supplied to the driving control part 232. That is, the control circuit 242 first allows the power stored in the power storage part 224 to be supplied to the driving control part 232 and secondly allows the power stored in the energy storage device 222 to be supplied to the driving control part 232. For example, during the initial acceleration of the article transport vehicle, the control circuit 242 may control the energy storage device 222 (i.e., a first energy storage device) and the power storage part 224 (i.e., a second storage device) such that at a first time point when the acceleration of the article transport vehicle starts, the power storage part 224 is first started to supply a first power to the driving control part 232, and at a predetermined time after the first time, the power storage part 224 continues to supply the first power to the driving control part 232, and the energy storage device 222 is started to supply a second power to the driving control part 232. Between the first time and the predetermined time, the power storage part 224 among the power storage part 224 and the energy storage device 222 supplies the first power to the driving control part 232, and after the predetermined time, the power storage part 224 and the energy storage device 222 supply the first power and the second power to the driving control part 232, respectively.

Figure 5:
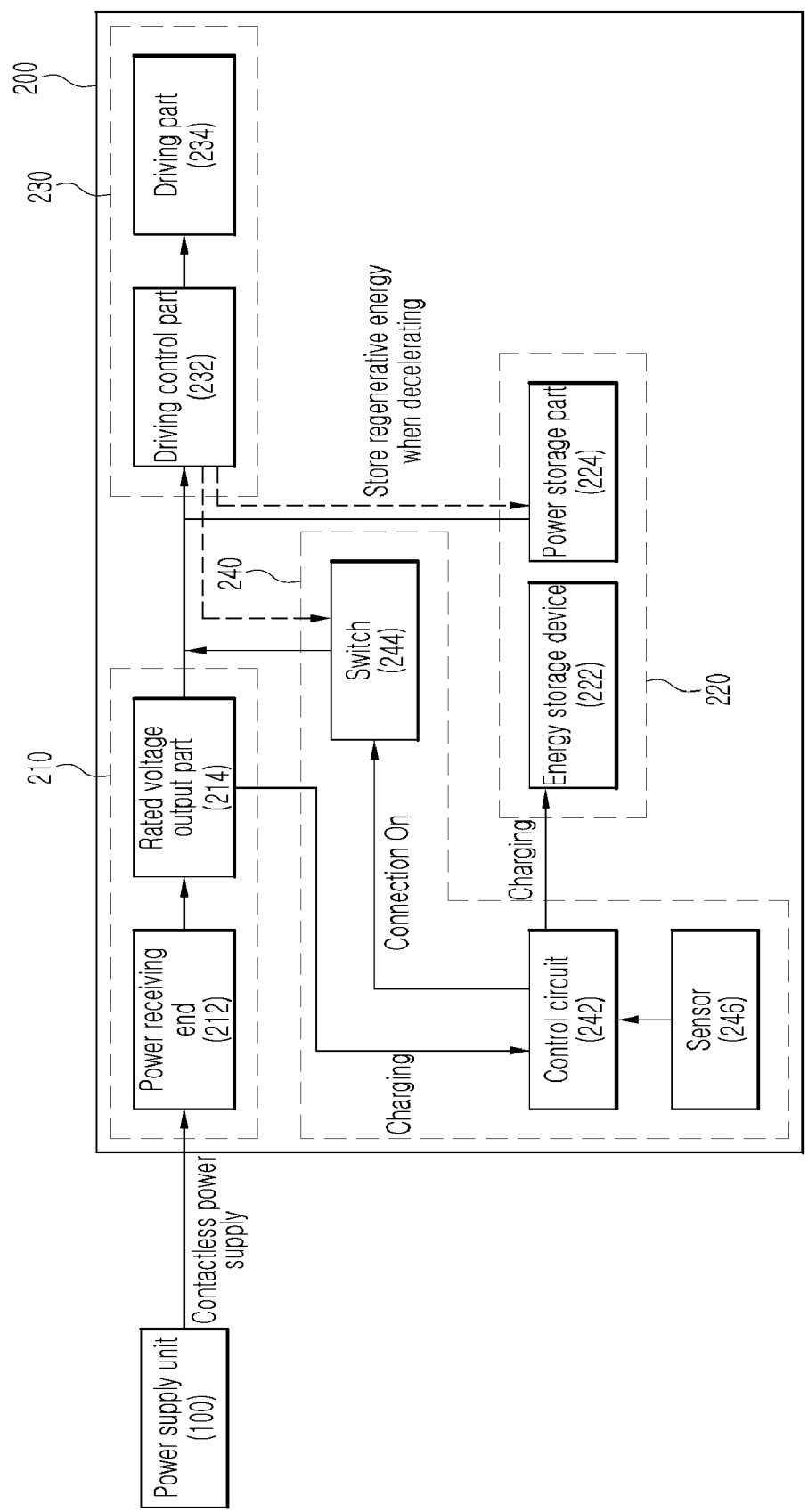
FIG. 5 illustrates an example of a process for managing the power when the article transport vehicle decelerates in the article transport system according to the embodiment of the present disclosure.

FIG. 5 illustrates an example of a process for managing the power when the article transport vehicle 200 decelerates in the article transport system according to the embodiment of the present disclosure. Referring to FIG. 5, when the article transport vehicle 200 enters a deceleration section and decelerates, the regenerative energy generated by the power generating unit 230 may be charged in the power storage part 224, and further, power may be charged in the energy storage device 222 through the rated voltage output part 214. That is, while the article transport vehicle 200 decelerates, the control circuit 242 allows the regenerative energy generated by the power generating unit 230 to be stored in the power storage unit 220. The power storage part 224 having a relatively long lifespan is first used, and the energy storage device 222 is used only when the energy storage device 222 is required as in a section without power supply, so the operating life of the energy storage device 222 may be maximally utilized.

Figure 6:
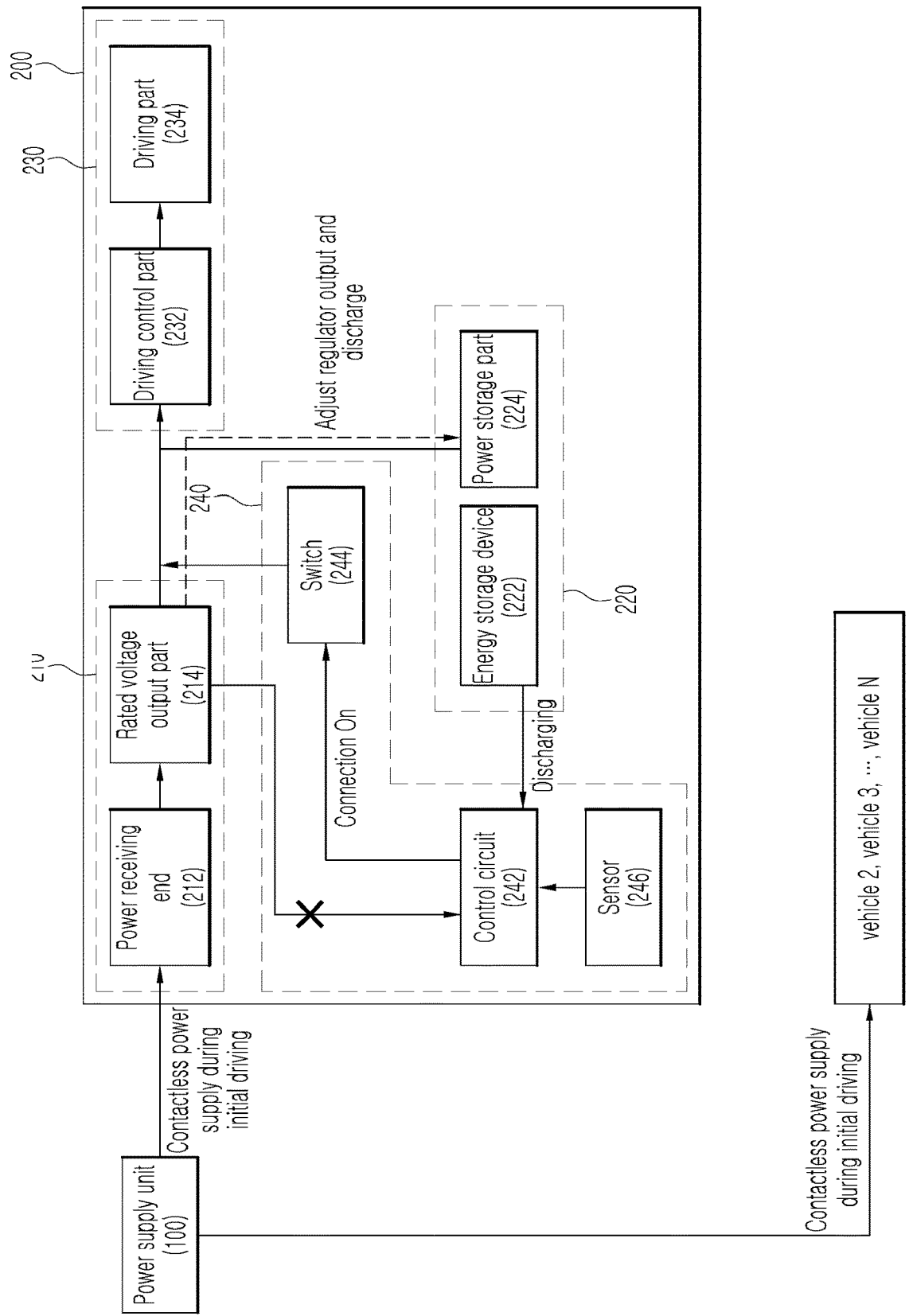
FIG. 6 illustrates an example of a process for managing the power when the article transport vehicle is initially driven in the article transport system according to the embodiment of the present disclosure.

FIG. 6 illustrates an example of a process for managing power when the article transport vehicle 200 is initially driven in the article transport system according to the embodiment of the present disclosure. For example, the process of FIG. 6 may be performed when the article transport vehicle 200 initially enters the driving route when the power of the driving route is restored after being down.

In a case in which there are many other vehicles receiving power from the power supply unit 100 during the initial driving of the article transport vehicle 200, to supply the power to each vehicle, overcurrent may occur in the power supply unit 100. Particularly, during the initial driving of the article transport vehicle 200, the rated voltage output part 214 uses maximum power to charge the power storage part 224. In this case, due to the overcurrent, the power supply unit 100 may be overloaded. Therefore, in a state in which the output power of the rated voltage output part 214 is limited by limiting the power supplied from the power supply unit 100, power stored in the energy storage device 222 is used to charge a voltage in the power storage part 224, thereby reducing the load of the power supply unit 100 and preventing the occurrence of an error in the power supply unit 100.

For example, in a case in which the permitted power of the power supply unit 100 is 20 kW and the maximum load of each vehicle is 1.5 kW, when there are 14 or more vehicles driving on the route of the associated power supply unit 100, an overpower error may occur in the power supply unit 100. When the article transport vehicle 200 initially enters the driving route, the energy storage device 222 is not charged but discharged to charge the power storage part 224, so the overpower error of the power supply unit 100 may be prevented. In this case, the output power of the rated voltage output part 214 is adjusted to 0.4 kW or less, so the overpower error of the power supply unit 100 can be prevented. In this case, the power supply unit 100 may power up to 50 vehicles.

That is, when the article transport vehicle 200 initially enters the driving route, the power storage part 224 may be charged by using energy stored in the energy storage device 222 in a state in which power supplied from the power supply unit 100 is limited to a predetermined level or less.

Figure 7:
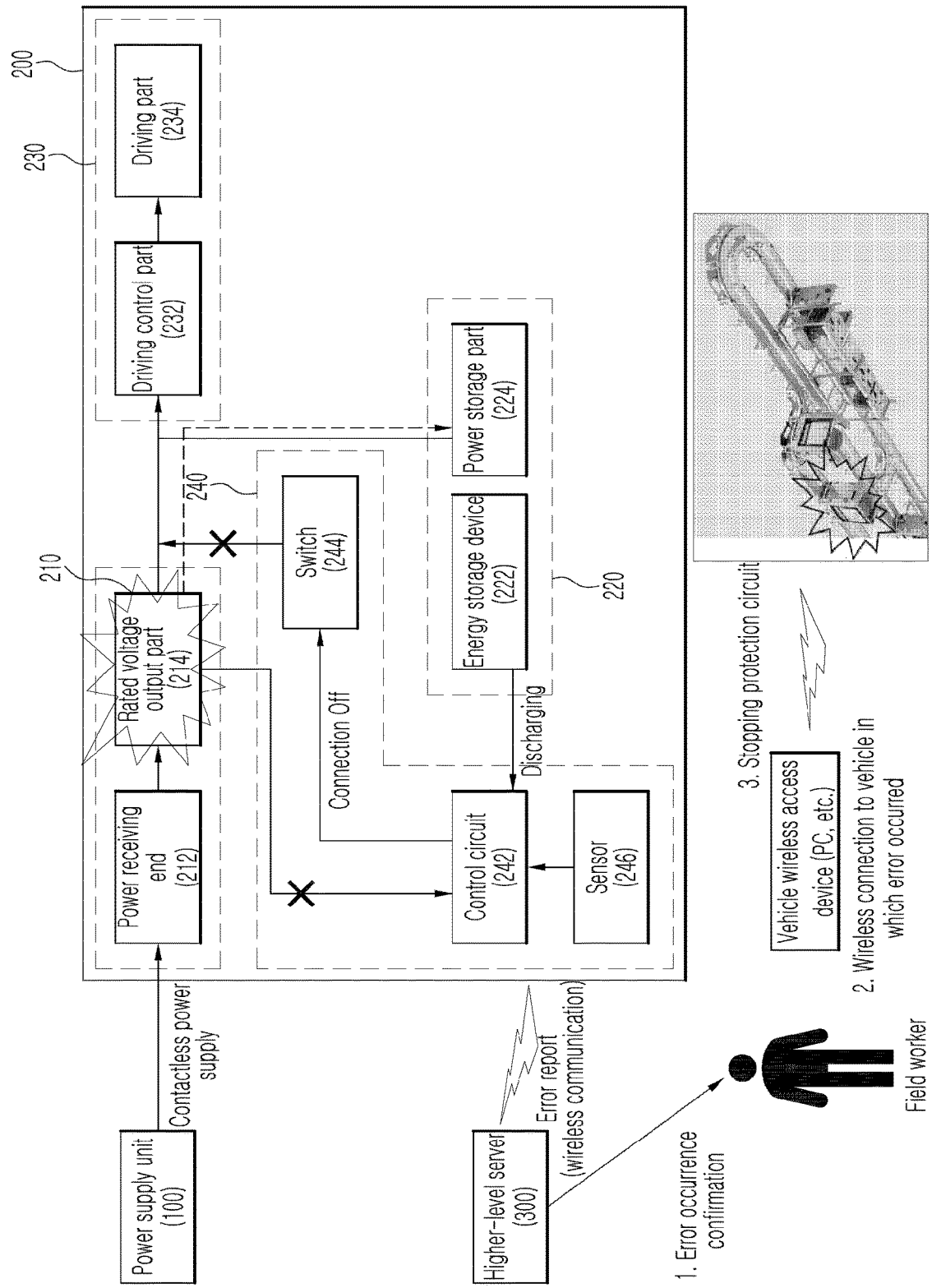
FIG. 7 illustrates an example of a process for managing the power when an abnormality occurs in the article transport vehicle in the article transport system according to the embodiment of the present disclosure.

FIG. 7 illustrates an example of a process for managing power when an abnormality occurs in the article transport vehicle 200 in the article transport system according to the embodiment of the present disclosure. Referring to FIG. 7, when an abnormality occurs in the article transport vehicle 200, a protection circuit of the rated voltage output part 214 operates, and power stored in the energy storage device 222 is supplied to the control circuit 242 in a state in which power transmitted to the power generating unit 230 is cut. The control circuit 242 monitors whether the abnormality of the article transport vehicle 200 stops by using the power supplied from the energy storage device 222.

The abnormality of the article transport vehicle 200 is transmitted to the higher-level server, and maintenance of the article transport vehicle 200 may be performed by a worker. When the abnormality of the article transport vehicle 200 stops, the control circuit 242 of the article transport vehicle 200 allows the operation of the protection circuit of the rated voltage output part 214 to stop. In this case, power is supplied to the control circuit 242 by the energy storage device 222, so a worker may interface with the control circuit 242 via wireless communication to stop the operation of the protection circuit of the rated voltage output part 214. On the other hand, when power supply performed by the energy storage device 222 stops, a worker uses a ladder to reach the article transport vehicle 200 and manually manipulates the article transport vehicle 200 such that the protection circuit of the rated voltage output part 214 stops. When the operation of the protection circuit of the rated voltage output part 214 stops, the power supplied by the power supply unit 100 may be used such that the article transport vehicle 200 operates normally.

That is, when an abnormality occurs in the article transport vehicle 200, the control circuit 242 allows the rated voltage output part 214 to stop the power supplied from the power supply unit 100, and monitors whether the abnormality of the article transport vehicle 200 stops by using the power stored in the energy storage device 222, and when the abnormality of the article transport vehicle 200 stops, the rated voltage output part 214 may supply the power supplied by the power supply unit 100 to the power generating unit 230.

Figure 8:
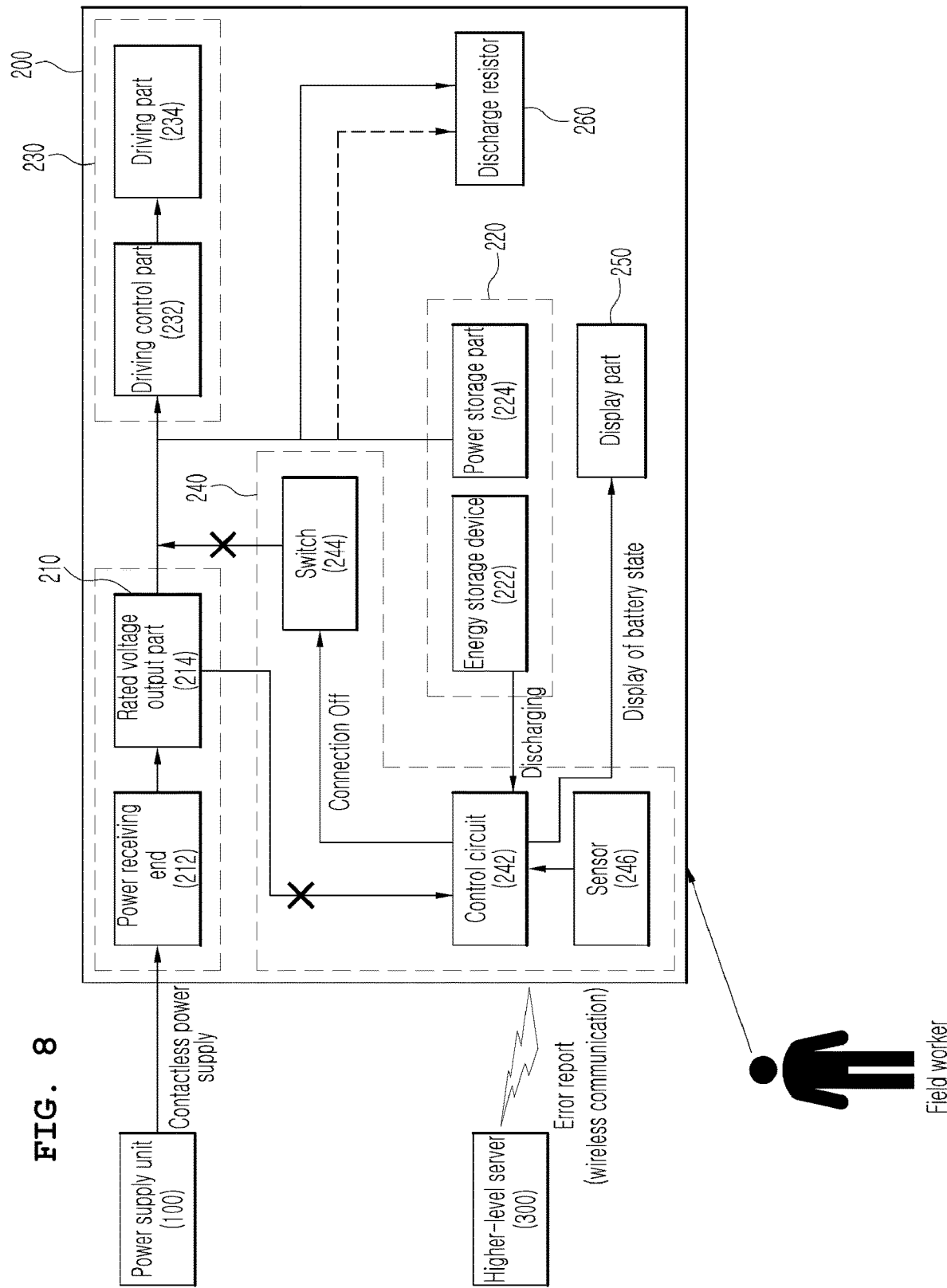
FIG. 8 illustrates an example of a process for managing the power when the maintenance of the article transport vehicle is performed in the article transport system according to the embodiment of the present disclosure.

FIG. 8 illustrates an example of a process for managing power when the maintenance of the article transport vehicle is performed in the article transport system according to the embodiment of the present disclosure. When performing the maintenance of the article transport vehicle 200, the maintenance of the article transport vehicle 200 may be performed by using power stored in the energy storage device 222 in a state in which power supply by the power supply unit 100 stops. In this case, a field worker can check remaining energy amount through a display part 250 (e.g., a display) provided in the article transport vehicle 200. When power stored in the energy storage device 222 is insufficient, the energy storage device 222 can be charged through wired charging. Furthermore, in a state in which the power output from the energy storage device 222 is cut off, that is, in a no-power state, the inspection of the article transport vehicle 200 may be performed.

In a case in which there is no power output by the rated voltage output part 214 and the power generating unit 230 does not operate, the control circuit 242 allows electrical connection between the rated voltage output part 214 and the power generating unit 230 to be cut and allows the power of the power storage part 224 to be discharged to the power generating unit 230 through a discharge resistor 260.

As described above, the apparatus for managing power of the article transport vehicle 200 in the article transport system may be expressed as follows. The apparatus for managing power of the article transport vehicle 200 according to the embodiment of the present disclosure includes: the power receiving unit 210 configured to receive power in a contactless manner from the power supply unit 100 installed at the driving route of the article transport vehicle 200 and to control the power; the power storage unit 220 configured to store a portion of the power supplied from the power receiving unit 210 and to supply the stored power; the power generating unit 230 configured to generate the driving power for driving the article transport vehicle 200 and to generate a power by using the power supplied from the power receiving unit 210 or the power storage unit 220; and the power control unit 240 configured to control the power paths between the power storage unit 220, the power receiving unit 210, and the power generating unit 230. The power control unit 240 allows power to be supplied to the power generating unit 230 from the power receiving unit 210 or allows power to be supplied to the power generating unit 230 from the power storage unit 220 on the basis of the operation state of the article transport vehicle 200 such that the power control unit 240 controls the power paths.

In the embodiment, when the power supply performed from the power supply unit 100 stops, the power control unit 240 allows the power of the power storage unit 220 to be supplied to the power generating unit 230.

In the embodiment, when the article transport vehicle 200 accelerates, the power control unit 240 allows the power supplied from the power receiving unit 210 and the power stored in the power storage unit 220 to be supplied to the power generating unit 230.

In the embodiment, the power control unit 240 first allows power stored in the power storage part 224 of the power storage unit 220 to be supplied to the power generating unit 230, and secondly allows power stored in the energy storage device 222 of the power storage unit 220 to be supplied to the power generating unit 230.

In the embodiment, when the article transport vehicle 200 decelerates, the power control unit 240 allows the regenerative energy generated by the power generating unit 230 to be stored in the power storage unit 220.

In the embodiment, when the article transport vehicle 200 initially enters the driving route, the power control unit 240 allows the power storage part 224 to be charged by the energy stored in the energy storage device 222 of the power storage unit 220 in a state in which the power supplied from the power supply unit 100 is limited to a predetermined level or less.

FIG. 9 illustrates a flow chart of a method for managing the power of the article transport vehicle in the article transport system according to the embodiment of the present disclosure. Each operation of FIG. 9 may be performed by a controller of the article transport vehicle 200 or the control circuit 242. The controller or the control circuit 242 may be implemented by one or more processors.

The method for managing power of the article transport vehicle in the article transport system according to the embodiment of the present disclosure may include: receiving power in a contactless manner from the power supply unit 100 installed at the driving route of the article transport vehicle into the power receiving unit 210 at S905; storing a portion of the received power in the power storage unit 220 at S910; and controlling power paths by allowing power to be supplied from the power receiving unit 210 to the power generating unit 230 or by allowing power to be supplied from the power storage unit 220 to the power generating unit 230 on the basis of the operation state of the article transport vehicle 200 at S925.

In the embodiment, the controlling of the power paths may include supplying the power of the power storage unit 220 to the power generating unit 230 when the power supply performed by the power supply unit 100 stops.

In the embodiment, the controlling of the power paths may include supplying power supplied from the power receiving unit 210 and power stored in the power storage unit 220 to the power generating unit 230 when the article transport vehicle 200 accelerates.

In the embodiment, the controlling of the power paths may include: first supplying power stored in the power storage part 224 of the power storage unit 220 to the power generating unit 230, and secondly supplying power stored in the energy storage device 222 of the power storage unit 220 to the power generating unit 230.

In the embodiment, the controlling of the power paths may include storing the regenerative energy generated by the power generating unit 230 in the power storage unit 220 when the article transport vehicle 200 decelerates.

In the embodiment, the controlling of the power paths may include: stopping power supplied from the power supply unit 100 by the rated voltage output part 214 of the power receiving unit 210 when an abnormality occurs in the article transport vehicle 200; monitoring whether the abnormality of the article transport vehicle 200 stops by using power stored in the power storage unit 220; and supplying the power supplied from the power supply unit 100 to the power generating unit 230 when the abnormality of the article transport vehicle 200 stops.

Although the embodiment of the present disclosure has been described above, the drawings referenced so far and the detailed description of the described invention are merely used for the purpose of illustrating the present disclosure, but are not used to limit meaning or the scope of the present disclosure described in the scope of claims. Therefore, those skilled in the art will appreciate that various modifications, additions and substitutions are possible, without departing from the scope and spirit of the invention as disclosed in the accompanying claims. Accordingly, the true technical protection scope of the present disclosure should be determined by the technical spirit of the appended claims.

What is claimed is:

1. An apparatus for managing power of an article transport vehicle, the apparatus comprising:
    a power receiving unit configured to receive and control a power in a contactless manner from a power supply unit installed along a driving route of the article transport vehicle;
    a power storage unit configured to store a portion of the power supplied from the power receiving unit;
    a power generating unit coupled to the power receiving unit and the power storage unit and configured to generate a driving power for driving the article transport vehicle by using at least one of a first power supplied from the power receiving unit and a second power supplied from the power storage unit; and
    a power control unit configured such that according to an operation state of the article transport vehicle, the at least one of the first power supplied from the power receiving unit and the second power supplied from the power storage unit is supplied to the power generating unit.

2. The apparatus of claim 1,
    wherein the power control unit is configured such that when the power supply unit stops supplying the power to the power receiving unit, the power storage unit supplies the second power to the power generating unit.

3. The apparatus of claim 1,
    wherein the power control unit is configured such that while the article transport vehicle accelerates, the power receiving unit and the power storage unit supply the first power and the second power to the power generating unit, respectively.

4. The apparatus of claim 3,
    wherein the power storage unit includes a power storage part and an energy storage device,
    wherein the power control unit is configured such that when the power storage unit supplies the second power to the power generating unit, the power storage part of the power storage unit starts to supply power stored therein to the power generating unit, and at a predetermined time after the power storage part has started to supply the power stored therein, the energy storage device of the power storage unit starts to supply power stored therein to the power generating unit.

5. The apparatus of claim 1,
    wherein the power control unit is configured such that while the article transport vehicle decelerates, regenerative energy generated by the power generating unit is stored in the power storage unit.

6. The apparatus of claim 1,
wherein the power storage unit includes a power storage part and an energy storage device,
wherein the power control unit is configured such that when the article transport vehicle enters the driving route in a state of the power supply unit supplying the power of a predetermined level or less to the power receiving unit, the power storage part is charged with power stored in the energy storage device.

7. The apparatus of claim 1,
wherein the power control unit is configured such that when an abnormality occurs in the article transport vehicle, a rated voltage output part of the power receiving unit stops supplying the power supplied from the power supply unit to the power generating unit and monitors whether the abnormality of the article transport vehicle stops by using power stored in the power storage unit, and when the abnormality of the article transport vehicle is monitored to stop, the rated voltage output part of the power receiving unit supplies the power supplied by the power supply unit to the power generating unit.

8. A method for managing power of an article transport vehicle of an article transport system, the method comprising:
receiving, by a power receiving unit, power in a contactless manner from a power supply unit installed at a driving route of the article transport vehicle into a power receiving unit;
storing a portion of the received power in a power storage unit; and
controlling power paths such that at least one of a first power from the power receiving unit and a second power from the power storage unit is supplied to the power generating unit according to an operation state of the article transport vehicle.

9. The method of claim 8,
wherein the controlling of the power paths comprises supplying the second power of the power storage unit to the power generating unit when the power supply unit stops supplying the power to the power receiving unit.

10. The method of claim 8,
wherein the controlling of the power paths comprises supplying the first power supplied from the power receiving unit and the second power from the power storage unit to the power generating unit while the article transport vehicle accelerates.

11. The method of claim 10,
wherein the supplying of the second power from the power storage unit to the power generating unit comprises:
starting to supply power stored in a power storage part of the power storage unit to the power generating unit, and
at a predetermined time after the starting to supply the power stored in the power storage part, starting to supply power stored in an energy storage device of the power storage unit to the power generating unit.

12. The method of claim 8,
wherein the controlling of the power paths comprises storing regenerative energy generated by the power generating unit in the power storage unit while the article transport vehicle decelerates.

13. The method of claim 8,
wherein the controlling of the power paths comprises:
stopping supplying the power supplied from the power supply unit to the power generating unit by a rated voltage output part of the power receiving unit when an abnormality occurs in the article transport vehicle;
monitoring whether the abnormality of the article transport vehicle stops by using the power stored in the power storage unit; and
supplying the power supplied by the power supply unit to the power generating unit when the abnormality of the article transport vehicle stops.

14. An apparatus for managing power of an article transport vehicle, the apparatus comprising:
a power receiving unit comprising a power receiving end configured to receive power in a contactless manner from a power supply unit installed along a driving route of the article transport vehicle, and a rated voltage output part configured to output a rated voltage generated from the power received by the power receiving end;
a power generating unit comprising a driving control part electrically connected to the rated voltage output part and configured to control a driving power for driving the article transport vehicle, and a driving part configured to generate the driving power for driving the article transport vehicle;
a power storage unit comprising an energy storage device configured to store a portion of the power supplied by the rated voltage output part and to supply power stored therein to the rated voltage output part, and a power storage part connected to an output end of the rated voltage output part and configured to store power generated by the power generating unit and to supply power stored therein to the power generating unit; and
a power control unit configured to control power paths among the power storage unit, the power receiving unit, and the power generating unit,
wherein the power control unit comprises:
a switch configured to control electrical connection between the power receiving unit and the power generating unit;
a control circuit configured to control the switch and electrical connection between the power receiving unit and the power storage unit; and
a sensor configured to supply information of the rated voltage of the rated voltage output part to the control circuit, wherein the control circuit controls power paths among the power storage unit, the power receiving unit, and the power generating unit according to an operation state of the article transport vehicle.

15. The apparatus of claim 14,
wherein the control circuit is configured such that when the power supply unit stops supplying the power to the power receiving unit, the power stored in the energy storage device is supplied to the driving control part.

16. The apparatus of claim 14,
wherein the control circuit is configured such that while the article transport vehicle accelerates, the power supplied by the rated voltage output part and the power stored in the power storage unit are supplied to the driving control part.

17. The apparatus of claim 16,
wherein the control circuit is configured such that when the power storage unit supplies power to the power generating unit, the power storage part starts to supply the power stored therein to the driving control part, and at a predetermined time after the power storage part has started to supply the power stored therein, the energy storage device starts to supply the power stored therein to the driving control part.

18. The apparatus of claim 14,
wherein the control circuit is configured such that while the article transport vehicle decelerates, regenerative energy generated by the power generating unit is stored in the power storage unit.

19. The apparatus of claim 14, wherein the control circuit is configured such that when the article transport vehicle enters the driving route in a state of the power supply unit supplying the power of a predetermined level or less to the power receiving unit, the power storage part is charged with power stored in the energy storage device.

20. The apparatus of claim 14,
wherein the control circuit is configured such that when abnormality occurs in the article transport vehicle, the rated voltage output part stops supplying the power supplied from the power supply unit to the power generating unit and monitors whether the abnormality of the article transport vehicle stops by using power stored in the energy storage device, and when the abnormality of the article transport vehicle is monitored to stop, the rated voltage output part supplies the power supplied by the power supply unit to the power generating unit.

* * * * *